United States Patent [19]
Sauer et al.

[11] Patent Number: 5,973,311
[45] Date of Patent: Oct. 26, 1999

[54] PIXEL ARRAY WITH HIGH AND LOW RESOLUTION MODE

[75] Inventors: Donald J. Sauer, Allentown, N.J.;
Nang T. Tran, Lake Elmo, Minn.

[73] Assignee: Imation Corp, Oakdale, Minn.

[21] Appl. No.: 08/798,852

[22] Filed: Feb. 12, 1997

[51] Int. Cl.$^6$ .............................. H04N 3/14; H01L 27/00
[52] U.S. Cl. ...................... 250/208.1; 348/302; 348/308
[58] Field of Search ........................ 250/208.1; 348/302, 348/304, 307, 308; 257/231, 232, 233

[56] References Cited

U.S. PATENT DOCUMENTS

| | | |
|---|---|---|
| 4,322,752 | 3/1982 | Bixby . |
| 5,134,489 | 7/1992 | Sauer . |
| 5,182,624 | 1/1993 | Tran et al. ................................ 257/40 |
| 5,235,195 | 8/1993 | Tran et al. ................................ 257/59 |
| 5,254,480 | 10/1993 | Tran ............................................ 437/2 |
| 5,262,871 | 11/1993 | Wilder et al. . |
| 5,315,101 | 5/1994 | Hughes et al. ........................ 250/208.1 |
| 5,336,879 | 8/1994 | Sauer ..................................... 250/208.1 |
| 5,381,014 | 1/1995 | Jeromin et al. ..................... 250/370.09 |
| 5,420,452 | 5/1995 | Tran et al. ............................... 257/428 |
| 5,424,529 | 6/1995 | Hashimoto et al. .................. 250/208.1 |
| 5,471,515 | 11/1995 | Fossum et al. ............................ 377/60 |
| 5,576,763 | 11/1996 | Ackland et al. ......................... 348/308 |

FOREIGN PATENT DOCUMENTS

WO 94/21998  9/1994  WIPO .

OTHER PUBLICATIONS

"CMOS Active Pixel Sensors–A Second Generation Solid–State Image Sensor Technology", Center for Space Microelectronics Technology, NASA/Jet Propulsion Laboratory, APS, Aug. 29, 1996.

Burke et al., "420×420 Charge–Coupled–Device Imager and Four–Chip Hybrid Focal Plane", Optical Engineering, vol. 26, No. 9, Sep, 1987.

Primary Examiner—Que T. Le
Assistant Examiner—Kevin Pyo
Attorney, Agent, or Firm—William K. Weimer

[57] ABSTRACT

Pixel array including a high resolution mode and a low resolution mode and method of reading out the pixel array in a high and low resolution mode. The pixel array includes a first signal line and a second signal line. An array of pixel elements are provided, each pixel element coupled to the first signal line or the second signal line. A switch mechanism is provided for coupling the first signal line to the second signal line. A mechanism is also provided for conveying a charge associated with each pixel element to the first signal line or the second signal line. A mechanism may also be provided for buffering signals between the first signal line, the second signal line, and an output signal line.

35 Claims, 12 Drawing Sheets

PIXEL ARRAY WITH HIGH AND LOW RESOLUTION MODE

BACKGROUND OF THE INVENTION

The present invention relates generally to pixel arrays, and more particularly, it relates to an imager display pixel array which may be selectively read out in a high resolution, and a low resolution mode.

Solid state detector arrays have been developed for consumer, commercial, scientific, medical, military and industrial applications. Consumer applications range from video to high-definition television. Industrial uses include robotics and machine vision; electronics imaging for advertising in communications; integrated text; and images in office work in publishing. Image sensors are also used for medical (mammography, chest x-rays), astronomy, spectroscopy, surveillance, airport luggage inspection, inspection of foreign objects in food stuffs, non-destructive testing in industry, and many other applications.

Solid-state devices, such as photodetectors, are used for detecting electromagnetic radiation, such as x-rays, infrared radiation, ultraviolet radiation, and visible light. The photodetector stores the image momentarily, and then, after a selected time interval, converts the image to an electrical signal. The strength of the generated electrical signal corresponds to the intensity of the visible light radiation. The electrical signal is converted to digital data and stored in a memory device or electrically displayed.

One known pixel array for use in imaging devices is suggested in U.S. Pat. No. 5,336,879 entitled "Pixel Array Having Imaging Forming Pixel Elements Integral with Peripheral Circuit Elements", issued on Aug. 9, 1994 to Donald J. Sauer, the same inventor as the present application. The entire disclosure of U.S. Pat. No. 5,336,879 is herein incorporated by reference.

The resolution of the output from the imager array is dependent upon the size and number of pixel elements in the imager array. High resolution pixel arrays have a slower read-out time due to the increased number of pixel elements. It is desirable to have a high resolution imager array which may be operated in a low resolution mode for faster read out of the signal representative of the detected image.

The field of medical imaging includes fluoroscopic imaging and radiographic imaging. In radiographic imaging, very high resolution read-out is desired. In contrast, for fluoroscopic imaging, the image may be read-out in a lower resolution mode, although it is desirable to obtain an image read-out within a fast period of time. Therefore, in one particular application, it is desirable to have a pixel array for use in a medical imaging apparatus which may be read-out in a low resolution fluoroscopy mode having high frame rates, or a high resolution radiographic mode. The consolidation of a low resolution and high resolution system into a single medical imaging device provides an economical and convenient, multifaceted imaging device in a single unit.

SUMMARY OF THE INVENTION

The present invention is a pixel array which may be operated in a high resolution mode with a slower read out and a low resolution mode for faster read out. The high/low resolution pixel array may be used in imaging or display processes. In one particular application, the pixel array in accordance with the present invention can be used in the area of medical imaging to read-out in a low resolution fluoroscopy mode and a higher resolution radiographic mode. This advantageous approach results in a low cost and convenient medical imaging device which consolidates fluoroscopy imaging and radiography imaging into a single system.

In one embodiment, the present invention includes a pixel array having a low resolution mode. The pixel array includes a first signal line and a second signal line. The pixel array further includes an array of pixel elements, each pixel element coupled to the first signal line or the second signal line. Switch means are included for coupling the first signal line to the second signal line. Means are also provided for conveying a charge associated with each pixel element to the first signal line or the second signal line. The pixel array switch means may be responsive to a low resolution input signal. The switch means may include a transistor.

The pixel array may include an output signal line. First means for buffering signals is coupled between the first signal line and the output signal line. Second means for buffering signals is coupled between the second signal line and the output signal line. The first means for buffering signals may include a transistor configured as a source follower, and the second means for buffering signals may include a transistor configured as a source follower. The pixel array may further comprise means for selectively outputting the buffered output signals to an imaging device. The means for selectively outputting the buffered output signals may include a multiplexer. The pixel array may further include means coupled to the first signal line and the second signal line for resetting the first signal line and the second signal line.

In another embodiment, the present invention includes a pixel array for use in an imaging device, the pixel array having an array of pixel elements, a first signal line, a second signal line, a pair of adjacent column select lines, and a pair of adjacent row select lines. The improvement includes means for coupling the first signal line to the second signal line. Each pixel element includes a phototransducer means, and switch means for conveying signals between the phototransducer means and a predetermined signal line, wherein the switch means is responsive to an activated row select line and an activated column select line. First means are provided for activating the pair of adjacent column select lines, and second means are provided for activating the pair of adjacent row select lines.

The first means for activating may include a shift register coupled to the pair of adjacent column select lines. The second means for activating may include a shift register coupled to the pair of adjacent row select lines. Means are included for providing a buffered output signal representative of the signals conveyed to the first signal line and the second signal line. The means for providing a buffered output signal may include a buffered output signal line, first means for buffering coupled between the first signal line and the buffered output signal line, and second means for buffering coupled between the second signal line and the buffered output signal line. The first means for buffering and the second means for buffering may include a transistor configured as a source follower.

In another embodiment, the present invention includes a method of reading out a pixel array in a low resolution mode. The method includes the steps of providing a first signal line and a second signal line. An array of pixel elements is provided, each pixel element is coupled to the first signal line or the second signal line. The first output signal line is coupled to the second output signal line. A charge associated with each pixel element is read to the first output signal line and the second output signal line, respectively.

An isolated output signal representative of the charges read out to the first output signal line and the second output signal line is provided. The output signal representative of the charges output to the first output signal line and the second output signal line may be conveyed to an imaging device. The first output signal line and the second output signal line may be reset to a reference voltage.

The method of reading a charge may further include providing a first row select line, a second row select line, a first column select line, and a second column select line. The first row select line and the second row select line are activated. The first column select line and the second column select line are activated. Each pixel element is responsive to the activation of a predetermined row select line and the activation of a predetermined column select line for reading the charge associated with the pixel element to a predetermined first output signal line or second output signal line. The first row select line and the second row select line may be activated by shifting adjacent ones through a shift register. The first output signal line may be coupled to the second output signal line by providing an input signal to a switch, wherein the switch is responsive to the input signal. The switch may utilize transistor logic.

Providing an isolated output signal representative of the sum of the charges read out to the first output signal line and the second output signal line may include providing a buffered output signal line. A first buffer circuit may be coupled between the first output signal line and the buffered output signal line, and a second buffer circuit may be coupled between the second output signal line and the buffered output signal line. The first buffer circuit and the second buffer circuit may include a transistor configured as a source follower.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof, and wherein.

DETAILED DESCRIPTION OF THE PREFERRED EMBODIMENTS

The present invention includes a high resolution imager array which may be operated in a low resolution mode for faster read out of the signal representative of the detected image. The imager array may include a matrix of pixel elements which employ photodetectors to detect the light emitted and a charge storage device (e.g., capacitor) to hold an amount of charge which depends on the intensity of the detected light.

Figure 1:
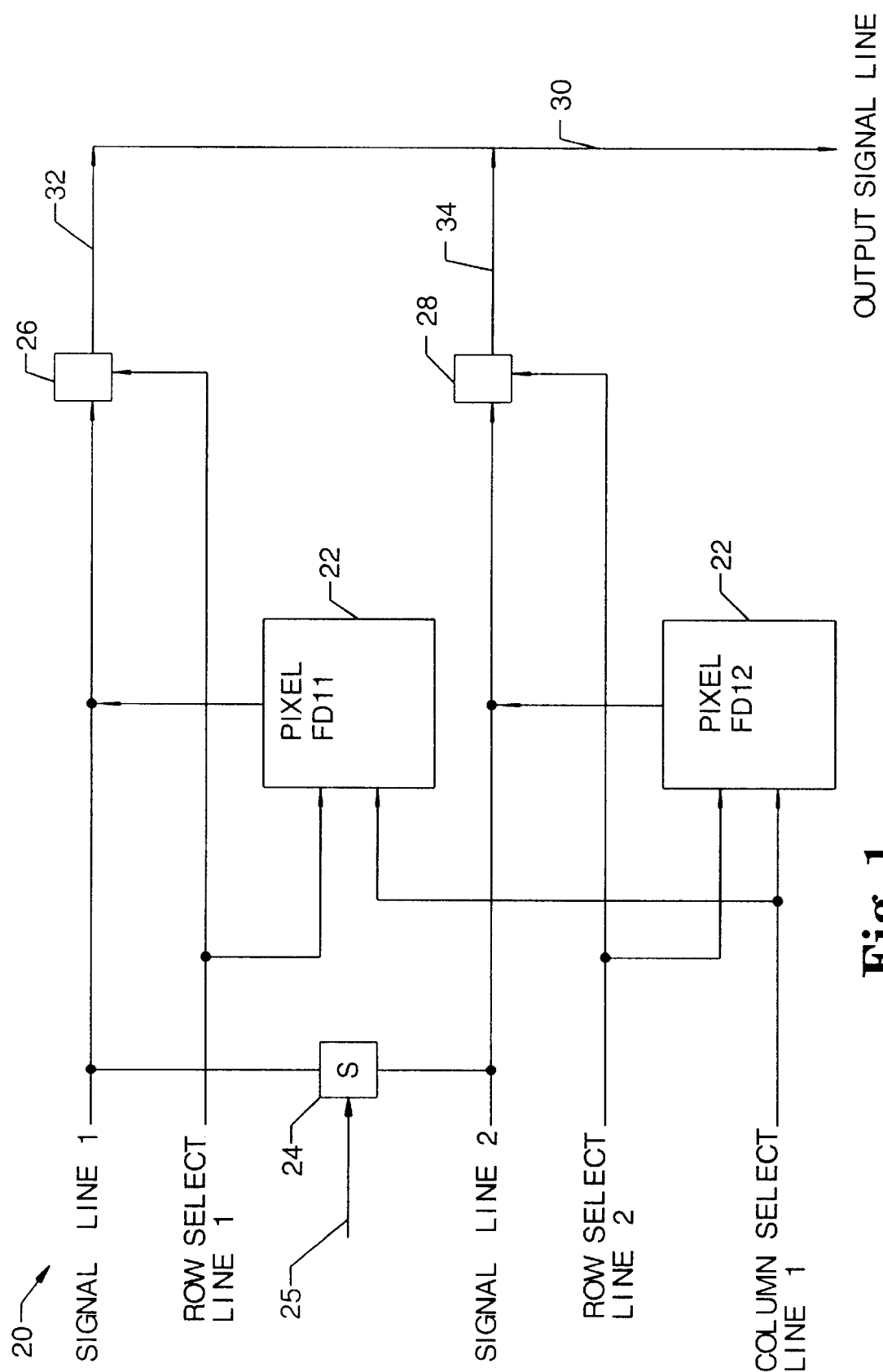
FIG. 1 is a block diagram of a pixel array having a low resolution mode in accordance with the present invention.

FIG. 1 shows a block diagram of a pixel array in accordance with the present invention generally at 20. The pixel array 20 includes pixel elements 22, which provide an output signal representative of the intensity of the visible light detected. The pixel array 20 may be operated in a low resolution mode, wherein adjacent pixel elements 22 are summed together to provide a faster read out of the image detected.

In pixel array 20, pixel elements 22 include a pixel FD11 and a pixel FD12. Pixel FD11 is electrically coupled to a signal line 1, and pixel FD12 is electrically coupled to a signal line 2. A low resolution switch 24 is electrically coupled between signal line 1 and signal line 2. Signal line 1 is coupled to buffer switch 26, and signal line 2 is coupled to buffer switch 28. Buffer switch 26 and buffer switch 28 may be included to provide isolated outputs to output signal line 30. Specifically, buffer switch 26 provides a buffered output signal 32 to output signal line 30, and buffer switch 28 provides a buffered output signal 34 to output signal line 30. When output simultaneously, the buffered output signal 32 and buffered output signal 34 are summed onto the output signal line 30.

Pixel array 20 may further include a row select line 1, a row select line 2, and a column select line 1. Row select line 1 is electrically coupled to pixel FD11 and buffer switch 26. Row select line 2 is electrically coupled to pixel FD12 and buffer switch 28. Column select line 1 is electrically coupled to pixel FD11 and pixel FD12.

In operation, when row select line 1 is activated and column select line 1 is activated, the charge of pixel FD11 is read out to signal line 1. When row select line 1 is activated, buffer switch 26 is enabled for providing the buffered output signal 32, representative of the charge on pixel FD11, output to signal line 30. Similarly, when row select line 2 and column select line 1 are both activated, the charge of pixel FD12 is read out to signal line 2, and when row select line 2 is activated, buffer switch 28 provides a buffered output signal 34, representative of the charge on pixel FD12, output to signal line 30.

Low resolution switch 24 may be activated to switch pixel array 20 from a high resolution mode to a low resolution mode using a low resolution input signal 25. When low resolution switch 24 is activated, signal line 1 is coupled to signal line 2, and the charge present on signal line 1 and signal line 2 are summed together. When buffer switch 26 and buffer switch 28 are enabled, signal line 1 and signal line 2 operate in parallel, with the sum of buffered output signal 32 and buffered output signal 34 being present on output signal line 30. As such, pixel array 20 operates in a low resolution mode with the signal present on output signal line 30 being representative of the sum of the two adjacent pixel elements 22, pixel FD11 and pixel FD12, to provide a low resolution output signal having a fast read out.

Figure 2:
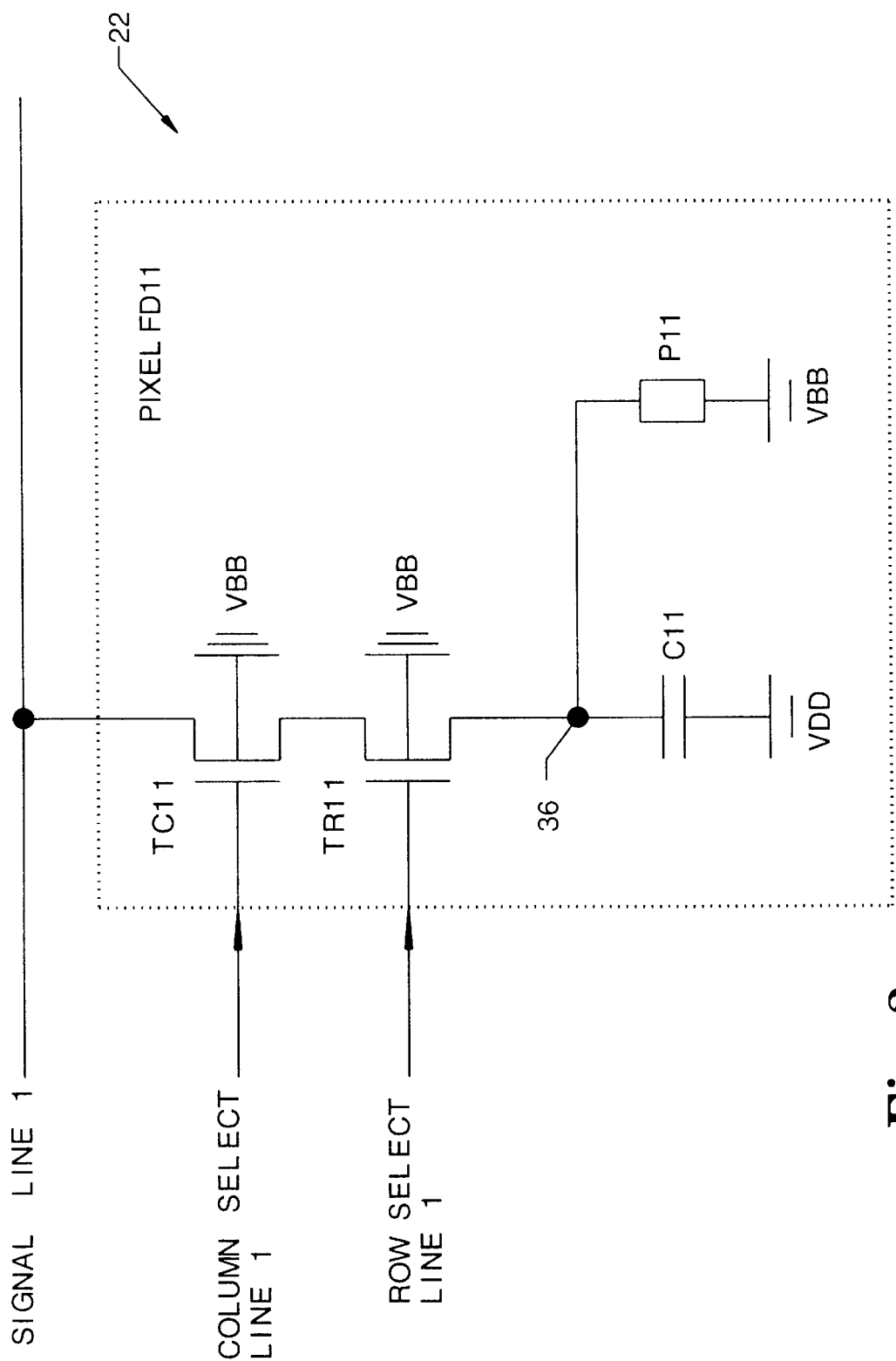
FIG. 2 is a schematic representation of one embodiment of a single pixel element in accordance with the present invention.

Referring to FIG. 2, a schematic representation of a pixel element 22 suitable for use in pixel array 20 is generally shown. In particular, pixel element FD11 is shown. The phototransducer device in pixel element 22 is photodetector P11. Photodetector P11, such as a photodiode, may be implemented using an n-well to p-substrate photodetector to integrate photo-generated charge. Capacitor C11 and photodetector P11 are coupled to a common node 36 to increase the maximum charge handling capacity of pixel element 22. In the exemplary embodiment, capacitor C11 is a thin-oxide (Tox) capacitor. Capacitor C11 may be coupled between node 36 and a reference voltage VDD. Photodetector P11 is coupled between node 36 and a reference voltage VBB.

Coupled between photodetector P11 (at node 36) and signal line 1 are two series connected transistors TC11 and TR11. Transistors TC11 and TR11 are responsive to the column select line 1 and row select line 1, respectively, such that when both are activated, the charge of pixel element 22 is read out to signal line 1. In the exemplary embodiment, transistors TC11 and TR11 may be NMOS transistors.

Figure 3:
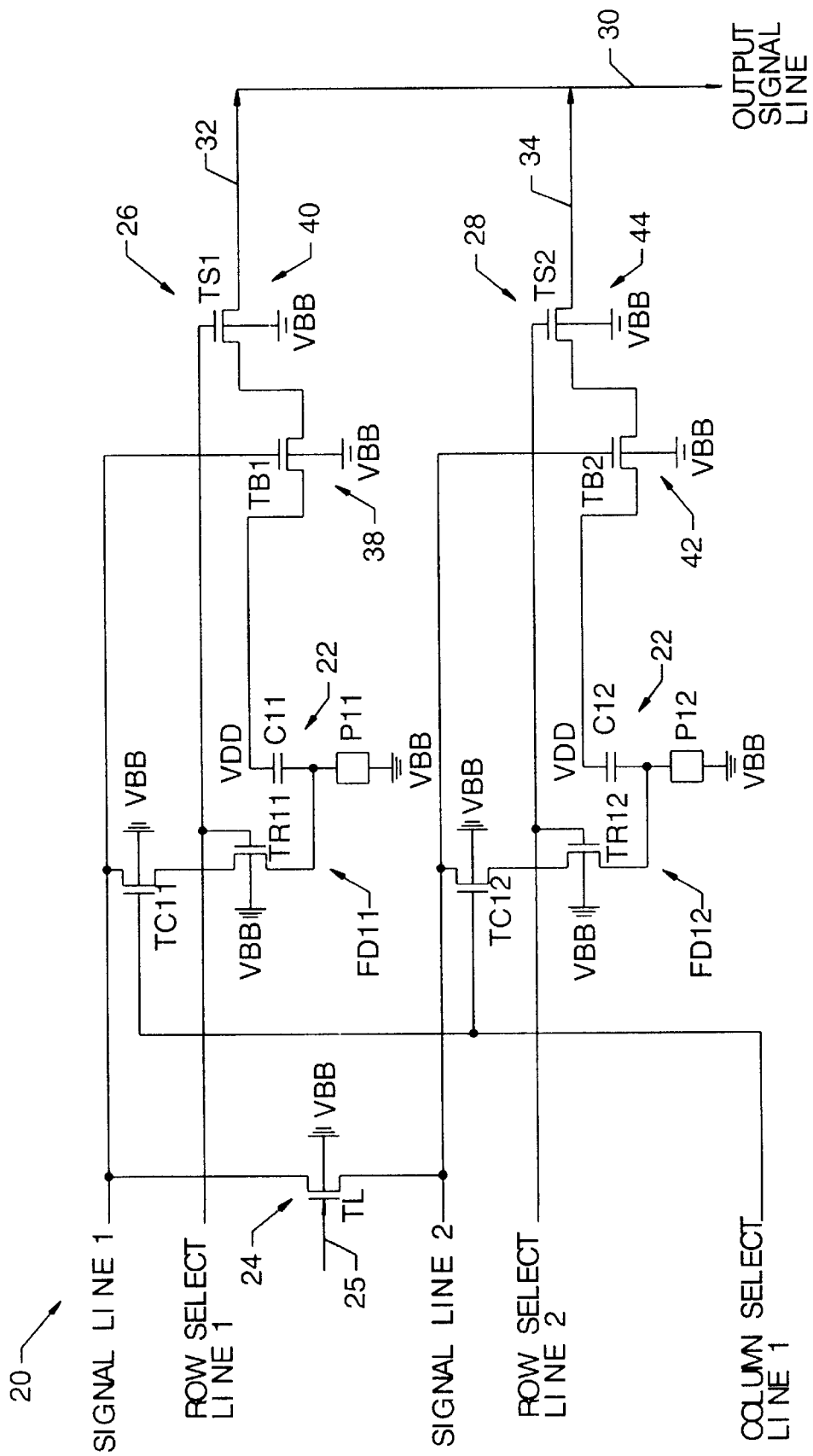
FIG. 3 is a schematic representation of one embodiment of the pixel array in accordance with the present invention shown in the block diagram of FIG. 1.

Referring to FIG. 3, a schematic diagram showing one embodiment of the pixel array 20 in FIG. 1 is shown. As shown, pixel elements 22 (specifically pixel FD11 and pixel FD12) are configured similar to the schematic representation of pixel element FD11 shown in FIG. 2 with pixel FD12 including a transistor TC12, a transistor TR12, a capacitor C12, and a phototransducer P12. In addition to pixel element 22, transistor logic is utilized to perform the functions of low resolution switch 24, buffer switch 26, and buffer switch 28.

Specifically, low resolution switch 24 may include an NMOS transistor TL configured as a switch, coupled between signal line 1 and signal line 2. The transistor TL drain is coupled to signal line 1, the transistor TL source is coupled to signal line 2, and the substrate bias is coupled to reference voltage VBB. A low resolution input signal 25 may be input to the transistor TL gate for activation of transistor TL, effectively coupling signal line 1 to signal line 2.

Buffer switch 26 may include isolation buffer 38 and output signal switch 40. In the embodiment shown, isolation buffer 38 may include NMOS transistor TB1 configured as a "source follower" transistor, and output signal switch 40 may include NMOS transistor TS1 configured as a switch. The drain of transistor TB1 is coupled to reference voltage VDD. The substrate bias of transistor TB1 is coupled to reference voltage VBB, the gate of transistor TB1 is coupled to signal line 1, and the source of transistor TB1 is coupled to the drain of transistor TS1. The substrate bias of transistor TS1 is coupled to reference voltage VBB, the gate of transistor TS1 is coupled to row select line 1, and the source of transistor TS1 is coupled to output signal line 30, indicated by buffered output signal 32.

Since isolation buffer 38 transistor TB1 is configured as a source follower, when the charge from pixel FD11 is read out to signal line 1, the source voltage of transistor TB1 follows the gate voltage providing a buffered output signal to the drain of transistor TS1 proportional to the charge present on signal line 1. When row select line 1 is active, transistor TS1 operates as a closed switch, and the buffered output signal 32 is read out to output signal line 30.

Similarly, buffer switch 28 can be configured similar to buffer switch 26, and includes isolation buffer transistor TB2 and output signal switch transistor TS2 for providing buffered output signal 34 to output signal line 30. Since the source followers transistor TB1 and transistor TB2 for the corresponding signal line 1 and signal line 2, respectively, operate in parallel, these source followers operate as a single NMOS source follower with twice the total channel width.

It has been found to be particularly advantageous to use a transistor configured as a source follower for isolation buffer 38 and isolation buffer 42 (coupled between signal line 1, signal line 2, and output signal line 30, respectively) since when multiple rows such as row select line 1 and row select line 2 are selected with the low resolution switch 24 activated (turned on) the gates of the multiple source follower buffers (38,42) are driven with the same voltage (due to the signal charge which is summed onto a combined signal line). Therefore, the multiple source followers (38,42) operate in parallel with the total load current for the output signal line 30 being split equally among the multiple source followers (38,42). Although it is recognized that if there are DC offsets (e.g., threshold variations) between the source followers, the devices with the lowest threshold will use a larger fraction of the available load current, but the voltage gained between the signal lines (signal line 1 and signal line 2) and the common output signal line 30 will remain close to unity.

It is also recognized that other circuit elements may be used as the buffer between the multiple signal lines (such as signal line 1 and signal line 2) and a common output signal line 30, such as an inverting amplifier. The use of an inverting amplifier may be less desirable than the use of a source follower, since it is recognized that additional circuit elements would be needed to switch in an appropriate load current proportional to the number of buffers operating in parallel, and DC offsets in the inverting amplifiers would cause the total gain and hence overall gain of the paralleled buffers to change, which may be undesirable.

Figure 4:
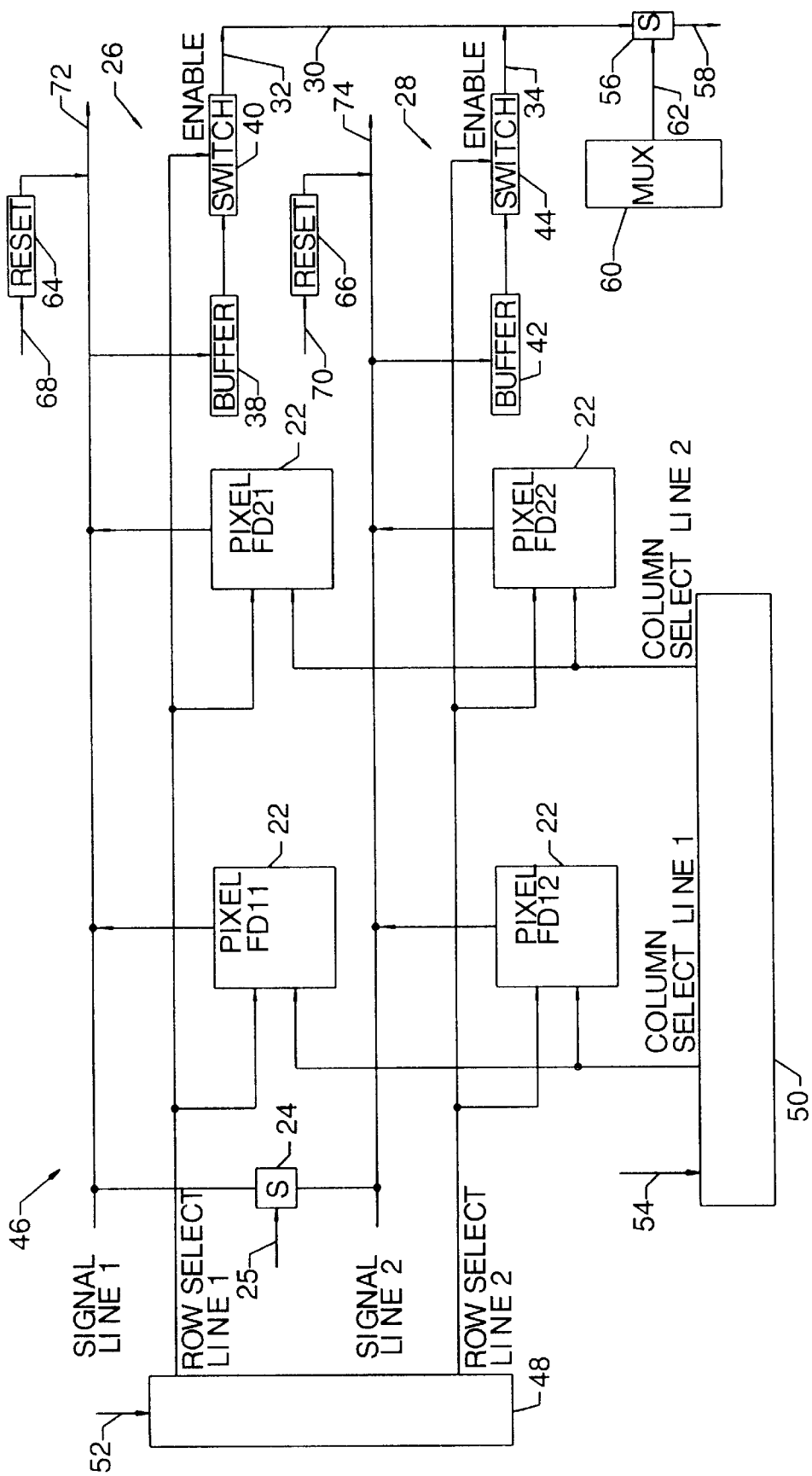
FIG. 4 is a block diagram of another embodiment of a 2×2 pixel array having a low resolution mode in accordance with the present invention.

Referring to FIG. 4, a 2×2 array 46 of adjacent pixel elements 22 is shown. The pixel elements 22 include pixel FD11, pixel FD12, pixel FD21, and pixel FD22. The 2×2 array of adjacent pixel elements 22 are coupled to row select line 1, row select line 2, column select line 1, and column select line 2. Specifically, pixel FD11 is coupled to row select line 1 and column select line 1. Pixel FD21 is coupled to row select line 1 and column select line 2. Pixel FD12 is coupled to row select line 2 and column select line 1, and pixel FD22 is coupled to row select line 2 and column select line 2. The pixel elements 22 can be similar to the pixel elements as previously described herein, such as is shown in FIG. 2.

The pixel array 46 may include a vertical shift register 48 and a horizontal shift register 50. Vertical shift register 48 may include clock input 52, and horizontal shift register 50 may include clock input 54. Row select line 1 and row select line 2 are coupled to the vertical shift register 48. Column select line 1 and column select line 2 are coupled to the horizontal shift register 50. The vertical shift register 48 may be responsive to the clock input signal 52 for selectively activating row select line 1 and row select line 2. The horizontal shift register 50 may be responsive to the clock input signal 54 for selectively activating column select line 1 and column select line 2.

As previously described herein, isolation buffer 38 and output signal switch 40 (indicated at 26) may be coupled to signal line 1 for providing a buffered output signal 32 to output signal line 30. Similarly, isolation buffer 42 and output signal switch 44 (indicated at 28) may be coupled in series with signal line 2 for providing a buffered output signal 34 to output signal line 30. Low resolution switch 24 may be coupled between signal line 1 and signal line 2 for vertically switching between a high resolution and low resolution mode.

In operation, the 2×2 pixel array 46 may be read out in high resolution mode by shifting data patterns through vertical shift register 48 and horizontal shift register 50 to selectively and independently read out the charge of each pixel element 22 on their corresponding signal line 1 and signal line 2. For operation of the 2×2 pixel array 46 in a low resolution mode, a low resolution signal 25 may be input to low resolution switch 24, coupling signal line 1 to signal line 2 to accomplish vertical summation of the corresponding pixel elements 22. A data pattern containing two adjacent ones may be shifted or clocked using clock input signal 52 through the vertical shift register, simultaneously activating row select line 1 and row select line 2. Similarly, horizontal summation may be accomplished by shifting or clocking a data pattern (using clock input signal 54) containing two adjacent ones through the horizontal shift register 50. The shifting of two adjacent ones through the horizontal shift register 50 simultaneously activates column select line 1 and column select line 2. With the row select lines and column select lines active, the charge for the pixel elements 22, pixel FD11, pixel FD12, pixel FD21 and pixel FD22, are summed onto both signal lines, signal line 1 and signal line 2, which effectively operate as a single node through low resolution switch 24. With the charge output from 2×2 pixel array 46 summed on signal line 1 and signal line 2, the resulting charge signal is split between isolation buffer 38 and isolation buffer 42. Isolation buffer 38 and isolation buffer 42 operate in parallel as a single isolation buffer for providing buffered output signal 32 and buffered output signal 34 summed onto output signal line 30, through corresponding switches 40 and 44.

Output signal line 30 may be coupled to a switch 56 for selectively outputting the signal voltage present on output signal line 30, indicated at 58. Multiplexer (MUX) 60 may provide an input signal 62 to switch 56. Switch 56 may be responsive to the multiplexer 60 input signal 62 for selectively providing an output signal 58 which may be converted to digital data and stored in memory (with other array output signals) or electrically displayed. In one embodiment, switch 56 may be an NMOS transistor having input signal 62 coupled to its gate for activation of the switch 56.

The 2×2 pixel array 46 may further include a reset 64 and a reset 66. Reset 64 is responsive to input signal 68 for resetting signal line 1 to a referenced voltage. Reset 66 is responsive to input signal 70 for resetting signal line 2 to a referenced voltage. It may be desirable to operate reset 64 and reset 66 to reset signal line 1 and signal line 2 to a referenced voltage before summing the charge of pixel elements 22 on output signal line 30. Further, since signal line 1 and signal line 2 may receive charged output signals from other pixel arrays, indicated by 72 and 74, respectively, after summation of the charges of pixel FD11, pixel FD12, pixel FD21, and pixel FD22 on signal line 1 and 2, it may be desirable to reset signal line 1 and signal line 2 to a referenced voltage before the charges of other pixel arrays are output to signal line 1 and signal line 2.

Figure 5:
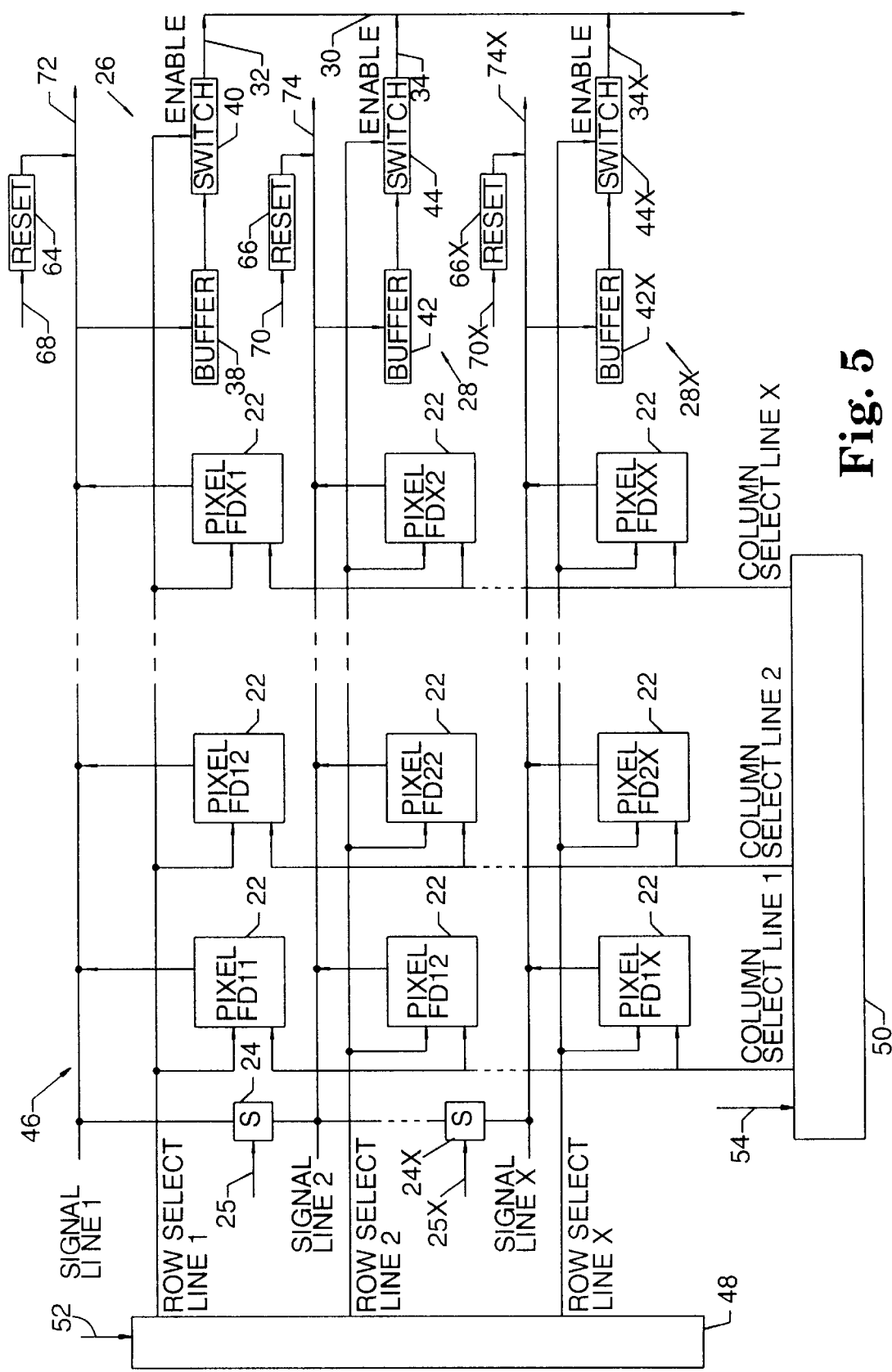
FIG. 5 is a block diagram of another embodiment of a pixel array having a low resolution mode in accordance with the present invention.

Referring to FIG. 5, it is recognized that any number of pixel elements (as may be contained in larger arrays) may be simultaneously summed together onto output signal line 30. In the horizontal direction, almost any number of pixel elements, as represented by pixel FDX1, pixel FDX2 and pixel FDXX, may be coupled to signal line 1, signal line 2 and signal line x for summing their output charge onto signal line 1, signal line 2 and signal line x. These pixel elements 22 would be coupled to horizontal shift register 50 through additional column select lines, as represented by column select line x. By shifting or clocking a data pattern containing a number of adjacent ones corresponding to the number of column select lines it is desired to activate, through the horizontal shift register 50, the desired number of column select lines will be activated.

Vertical summation of additional pixel elements can also be accomplished through additional row select lines, which may be coupled to vertical shift register 48. In the exemplary embodiment shown, pixel elements pixel FD1X, pixel FD2X, and pixel FDXX represent an additional row of pixel elements which are coupled to an additional row select line x. The row select line x is coupled to the vertical shift register 48. An additional signal line x is provided. Pixel FD1X, pixel FD2X, and pixel FDXX may be coupled to signal line x for providing an output signal charge to signal line x representative of the charge on the corresponding pixel. For operation in a low resolution mode, an additional switch, indicated as 24x, must be coupled between signal line x and one of the other signal lines, such as signal line 2 as shown. Switch 24x can be similar to switch 24 as previously described herein, and may also be responsive to low resolution activation signal 25, or a separate activation signal 25x. To accomplish vertical summation, a low resolution signal 25,25x can be input to low resolution switch 24 and low resolution switch 24x, coupling signal line 1, to signal line 2, to signal line x, such that they function as a single mode. A data pattern containing a number of adjacent ones corresponding to the number of row select lines is shifted through the vertical shift register 48 simultaneously activating row select line 1, row select line 2, and row select line x. As such, vertical summation is now accomplished.

Similar to row select line 2, the charge output to signal line x may be output through a buffer 42x and a switch 44x, wherein the switch is enabled by row select line x. A buffered output signal 34x representative of the summed charge output to signal line x is output for summation on output signal line 30. Similarly, a reset 66x is responsive to reset input signal 70x for resetting the signal line x to a reference voltage after the charge of pixel element 22 is output to signal line x. Signal line x is further coupled to other pixel arrays, indicated by 74x.

Figure 6:
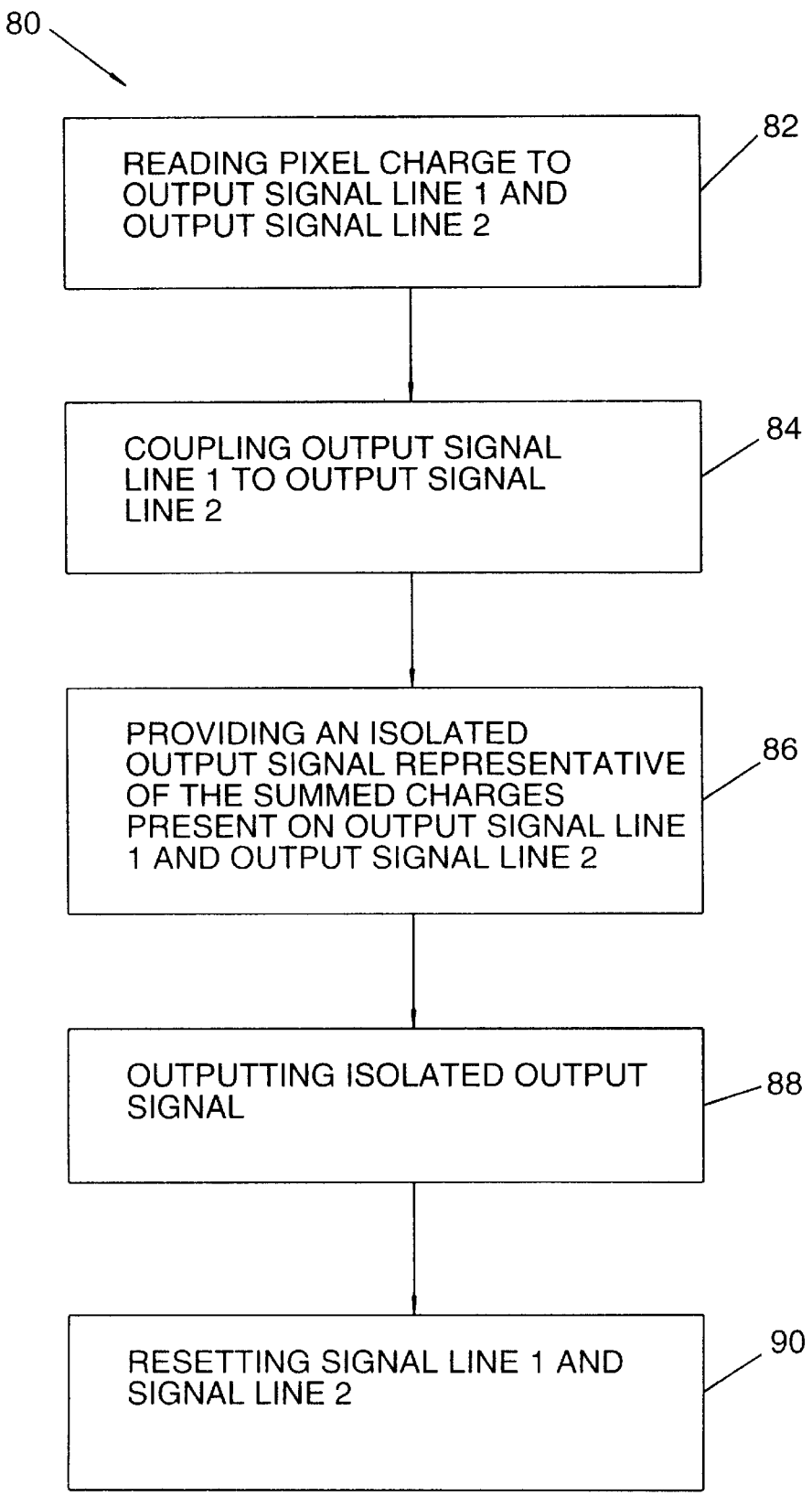
FIG. 6 is a flow diagram of one embodiment of a method of operation of a pixel array having a low resolution mode in accordance with the present invention.

Referring to FIG. 6, the present invention includes a method of reading out an imager in a low resolution mode which allows higher frame rates by binning (summing) the signal charge contained in an array of adjacent pixels. In one exemplary embodiment, the array is a 2×2 array of adjacent pixels as shown in FIG. 4.

Referring to the flow diagram of FIG. 6 and the exemplary embodiment of FIG. 4, the method of summing adjacent pixel elements in a 2×2 pixel array includes reading the pixel charges of the 2×2 pixel array to their corresponding output signal line 1 and output signal line 2 (82). For summation of the charges on signal line 1 and signal line 2, signal line 1 is coupled to signal line 2 (84). An isolated output signal may be provided which is representative of the summed charges present on signal line 1 and signal line 2 (86). The resulting isolated output signal may be multiplexed with output signals from other pixel arrays for selectively outputting the output signal, such as to a memory device or for electrical display (88) in an imaging device. Once the charges are read out, signal line 1 and signal line 2 may be reset (90).

Figure 7:
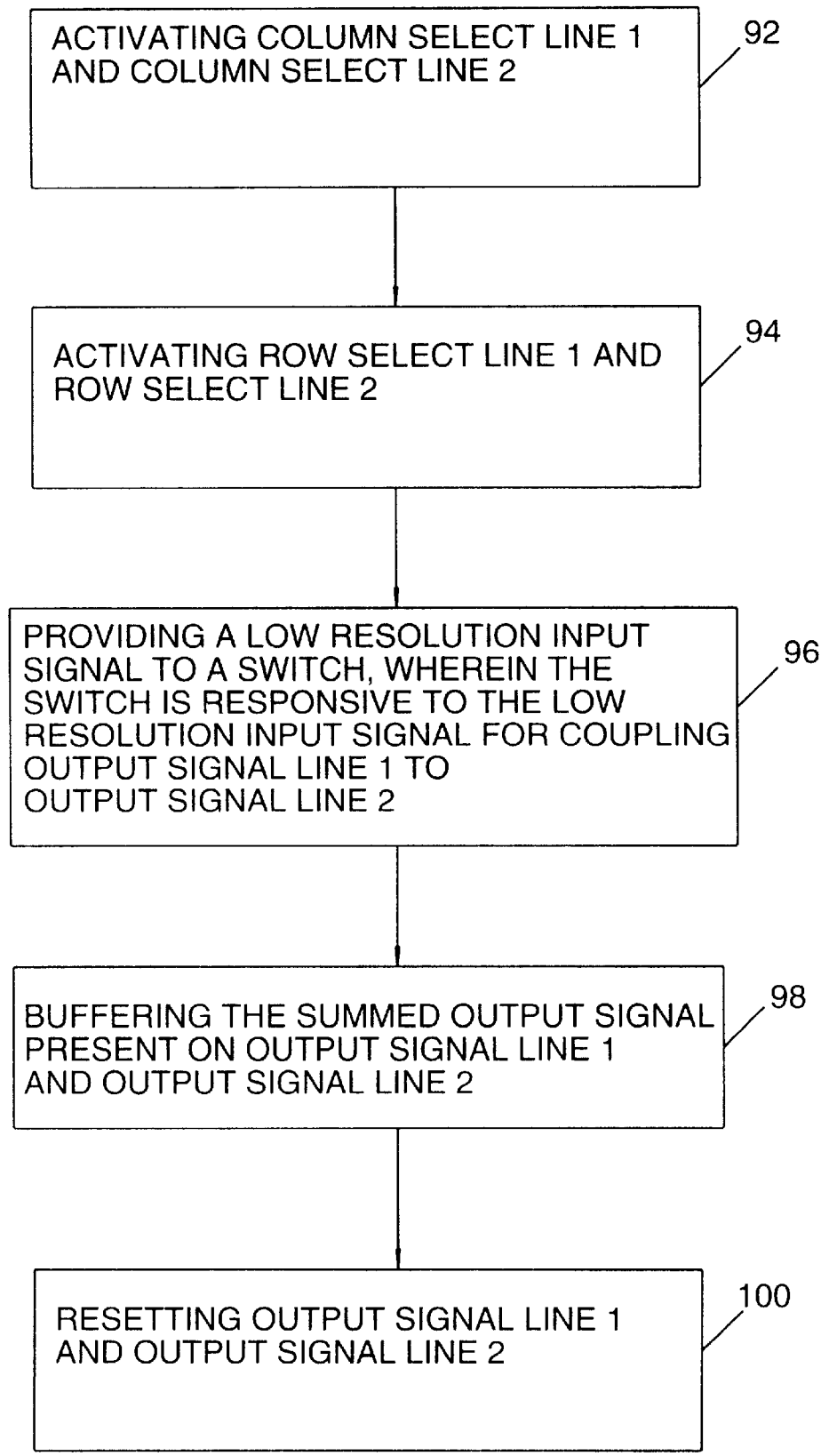
FIG. 7 is a flow diagram of another embodiment of a method of operation of the pixel array having a low resolution mode in accordance with the present invention.

Referring to FIG. 7, in reading the pixel charge to output signal line 1 and output signal line 2, horizontal summation may be accomplished by activating column select line 1 and column select line 2 (92). Column select line 1 and column select line 2 may be activated by shifting or clocking adjacent ones through the horizontal shift register 50. The adjacent ones may be shifted through the horizontal shift register 50 using two mutually exclusive phases of a single multi-phase clock signal 54, as will be described in detail later herein.

Vertical summation may be accomplished by activating row select line 1 and row select line 2 (94). Row select line 1 and row select line 2 may be activated by shifting or clocking adjacent ones through the vertical shift register 48. The adjacent ones may be clocked through the vertical shift register 48 using two mutually exclusive phases of a single multi-phase clock signal 52.

Summation of the charged output to output signal line 1 and output signal line 2 may be accomplished by coupling output signal line 1 to output signal line 2. Output signal line 1 may be coupled to output signal line 2 by providing a low resolution input signal 25 to a switch 24 for coupling output signal line 1 to output signal line 2 (96). In the preferred embodiment, the switch mechanism 24 may include transistor logic as previously described herein.

The isolated output signal may be output to the imaging device through a source follower transistor. In one preferred embodiment, the output signal on signal line 1 and signal line 2 is output to output signal line 30 through isolation buffer 38 and isolation buffer 42 (98). In the preferred embodiment, isolation buffer 38 and isolation buffer 42 are transistors configured as source followers, as previously described herein, which operate in parallel as a single source follower having twice the channel width.

Output signal line 1 and output signal line 2 may be reset by providing a reset input signal to a reset switch for resetting output signal line 1 and output signal line 2 to a referenced voltage (100). In the preferred embodiment previously described herein, the reset switch includes transistor logic.

Figure 8:
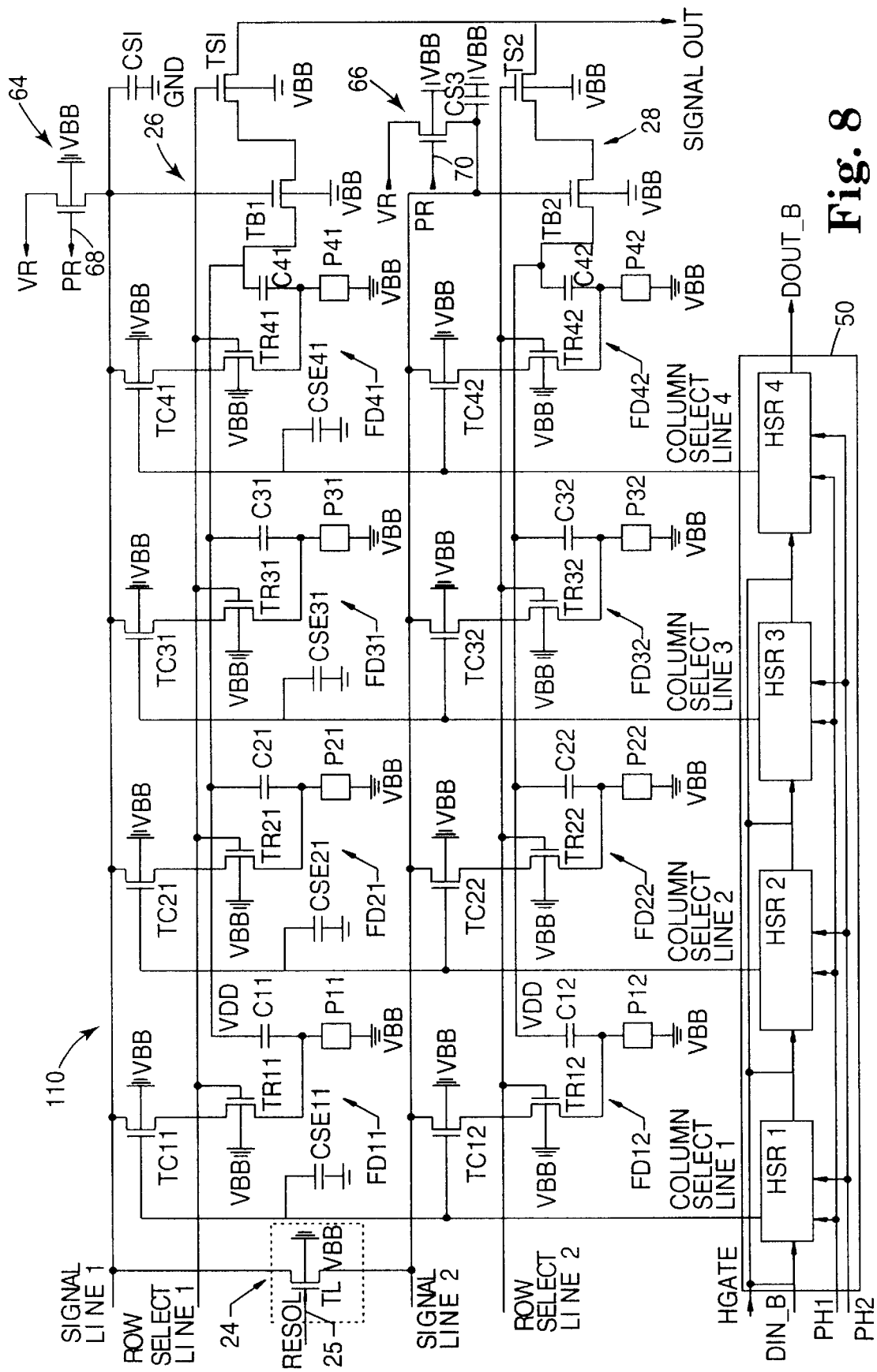
FIG. 8 is a schematic representation of an exemplary embodiment of a pixel array having a low resolution mode in accordance with the present invention.

Referring to FIG. 8, one exemplary embodiment of a method and apparatus for reading out an imager in a low resolution mode which allows higher frame rates by binning (summing) the signal charge contained in adjacent 2×2 arrays of adjacent pixels is generally shown at 110. In this example, one embodiment of the 2×2 pixel array of FIG. 4 is shown in schematic form, including pixel elements FD11, FD21, FD12, and FD22. The pixel array 110 further includes an additional 2×2 pixel array FD31, FD41, FD32 and FD42. The schematic for array 110 was used to perform an MSPICE simulation circuit analysis of the low resolution mode of operation of the pixel array in accordance with the present invention. The circuit, as shown, includes two rows and four columns of pixels, and all other transistors on the die associated with the signal lead out path including estimates for internal and external parasitic capacitance loading.

The initial conditions for phototranducers P11, P21, P31, P41, P12, P22, P32, and P42 is a reference voltage of four volts to simulate a previous reset operation. The effect of an optical input signal on the phototransducers was simulated by short current pulses applied to the internal phototransducers. The signal charge used for each pixel phototransducer is listed in the table below:

TABLE 1

| FD11 | 25.3 Me- | FD31 | 3.7 Me- |
| FD21 | 29.0 Me- | FD41 | 7.4 Me- |
| FD12 | 32.7 Me- | FD32 | 11.1 Me- |
| FD22 | 36.4 Me- | FD42 | 14.8 Me- |

The circuit elements used in the simulation are as follows:
Capacitors: C11, C21, C32, C41, C12, C22, C32, and C42 are 1.5 pF
Parasitic Capacitance: CSE11, CSE21, CSE31, and CSE41 are 3 pF; CS1 and CS2 are 2.3 pF
Transistors: TL, TR11, TR21, TR31, TR41, TR12, TR22, TR32, TR42, TS1, TS2, TS3 are NMOS transistors
VR=4 volts
VDD=6 volts
VBB=−3 volts The horizontal shift register 50 includes four stages, HSR1, HSR2, HSR3, and HSR4, to generate the column select lines 1–4. Column select line 1 is coupled to HSR1, column select line 2 is coupled to HSR2, column select line 3 is coupled to HSR3, and column select line 4 is coupled to HSR4. The horizontal shift register 50 further includes input signals HGATE and DIN_B and clock inputs PH1 and PH2. The clock signals PH1 and PH2 are two mutually exclusive phases of a single multi-phase clock signal. The frequency of the signal is desirably much greater than the scanning frequency of the pixel array.

Row select line 1 and row select line 2 in this simulation were held constant at 6 volts, simulating the presence of two adjacent data ones in the vertical shift register (for example, vertical shift register 48 shown in FIG. 4), in order to read out the imager in a low resolution mode. Additionally, the low resolution control input signal 25, indicated as RESOL, was held constant at 6 volts to activate low resolution switch 24.

The timing in the simulation was setup to sequentially read out the sum of the signal charge stored on pixels FD11, FD21, FD12, FD22, followed by reading out the sum of the signal charge stored on pixels FD31, FD41, FD32, and FD42. Near the end of the read out period, while two adjacent column select lines are still high, a positive pulse (68,70) was applied to reset 64 and reset 66 to reset signal line 1 and signal line 2 to referenced voltage VR (4 volts) and also reset the internal pixels which are currently selected (for example, FD11, FD21, FD12 and FD22) to VR (4 volts). The simulated signal output sensitivity at SIGNAL OUT is 0.012 uV/e— or a maximum output amplitude of 1.92 Vpp for a 4×40=160 M e— summed full well signal.

Figure 9:
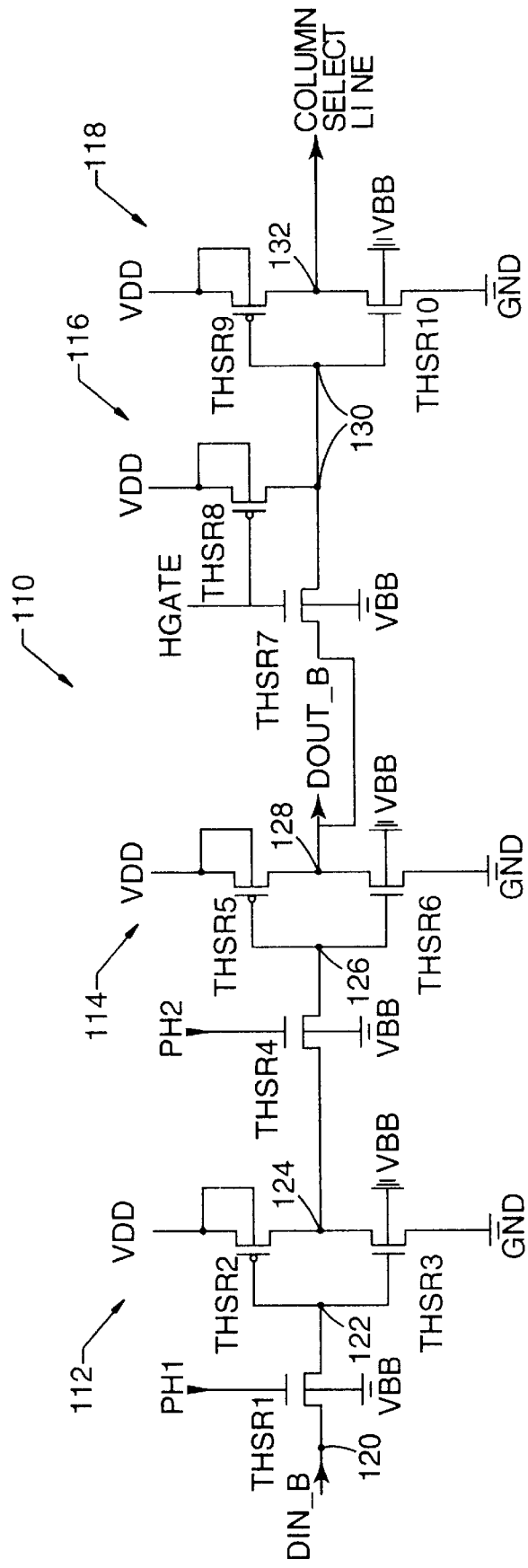
FIG. 9 is a schematic representation of one embodiment of a shift register shown in FIG. 8.

Referring to FIG. 9, a basic shift register stage 110 used to implement a read out scheme is shown. The basic shift register 110 may be used for one or all of the rows and columns of the pixel array, by connecting a plurality of the shift register stages 110 in series, such as HSR1, HSR2, HSR3 and HSR4. The shift register 110 has an active low signal (i.e., logic-low) at input terminal DIN_B which is propagated through the shift register responsive to the pulses of clock signals PH1 and PH2. The electrical charge caused by gating the potential is stored on the capacitance of the gate electrodes of the transistors which make-up the inverter circuits in shift register 110. It is noted that the input signals to the inverters are relatively long. The capacitance of these lines augments the input capacitance to the inverters, allowing electrical charge to be stored on the input terminals of the respective inverters in the time between the clock phase PH1 and clock phase PH2.

The shift register 110 may include transistors configured for a master-slave operation, and includes transistor THSR1, master inverter 112, transistor THSR4, slave inverter 114, transistor THSR7, inverter 116, and inverter 118. The input terminal 120 is coupled to the drain of transistor THSR1, having a gate coupled to clock signal PH1, a substrate biased coupled to reference voltage VBB, and a source coupled to master inverter 112.

The output of transistor THSR1 is coupled to the input terminal of master inverter 112 at node 122. Master inverter 112 includes transistor THSR2, having an inverter configuration, and transistor THSR3. In one embodiment, the transistor THSR2 may be a CMOS inverter P channel transistor and the transistor THSR3 may be an N channel transistor. The drain of transistor THSR2 and the drain of transistor THSR3 may be coupled together, indicated at node 124.

The output of master inverter 112 is coupled to the input of transistor THSR4 at node 124 having its gate coupled to clock signal PH2. The output of transistor THSR4 is coupled to slave inverter 114 having transistor THSR5, configured as an inverter, and transistor THSR6 (similar to master inverter 112). The output of slave inverter 114, at node 128, connects to the next shift register stage 110 (indicated by DOUT_B). Further, the output of slave inverter 114, at node 128, is coupled to transistor THSR7 having a gate coupled to HGATE. The gate of transistor THSR7 is coupled to inverting transistor THSR8. The output of transistor THSR7 is coupled to the input of inverter 118, indicated by node 130. Inverter 118 is configured similar to slave inverter 114, and includes transistor THSR9 and transistor THSR10. The output of inverter 118 is coupled to a column select line, indicated by node 132. In one embodiment, transistors TSHR2, TSHR5, TSHR8 and TSHR9 may be CMOS inverter, P channel transistors. Transistors TSHR1, TSHR3, TSHR4, TSHR6, TSHR7, and TSHR10 may be N channel transistors.

In operation, for activation of column or row select lines, the basic shift register element 110 is used to implement a read-out scheme having an active low signal (i.e., logic-low) at input terminal 120 which is propagated through the transistor TSHR1 responsive to a pulse of the clock signal PH1.

The logic low at the terminal 122 of inverting transistor 112 causes a logic high at output terminal 124. Next, in response to a pulse of a clock signal PH2, the logic high signal is propagated through transistor TSHR4 to terminal 126 of slave transistor 114. The logic high present at terminal 126 propagates through slave transistor configuration 114, causing a logic low at terminal 128.

The logic low output at terminal 128 represents the data input to the next shift register element 110. Next, when HGATE is activated, the logic low at 128 is propagated through transistor TSHR7 to terminal 130, and is present at the input of inverting transistor configuration 118. It is noted that while the horizontal clocks PH1 and PH2 are active, HGATE is held low to prevent undesired charge sharing at the boundaries between adjacent 2×2 arrays of pixels. HGATE is turned on to activate (enable) a new set of adjacent column select lines only after the data in the horizontal shift register has been moved by two stages. A logic low present at terminal 130 passes through inverting transistor configuration 118 causing a logic high at output terminal 132, which is coupled to a column select line. The logic low signal present at input terminal 120 has now been clocked (or shifted) through shift register 110 to provide an active high signal at output terminal 132, activating the desired column select line.

Figure 10:
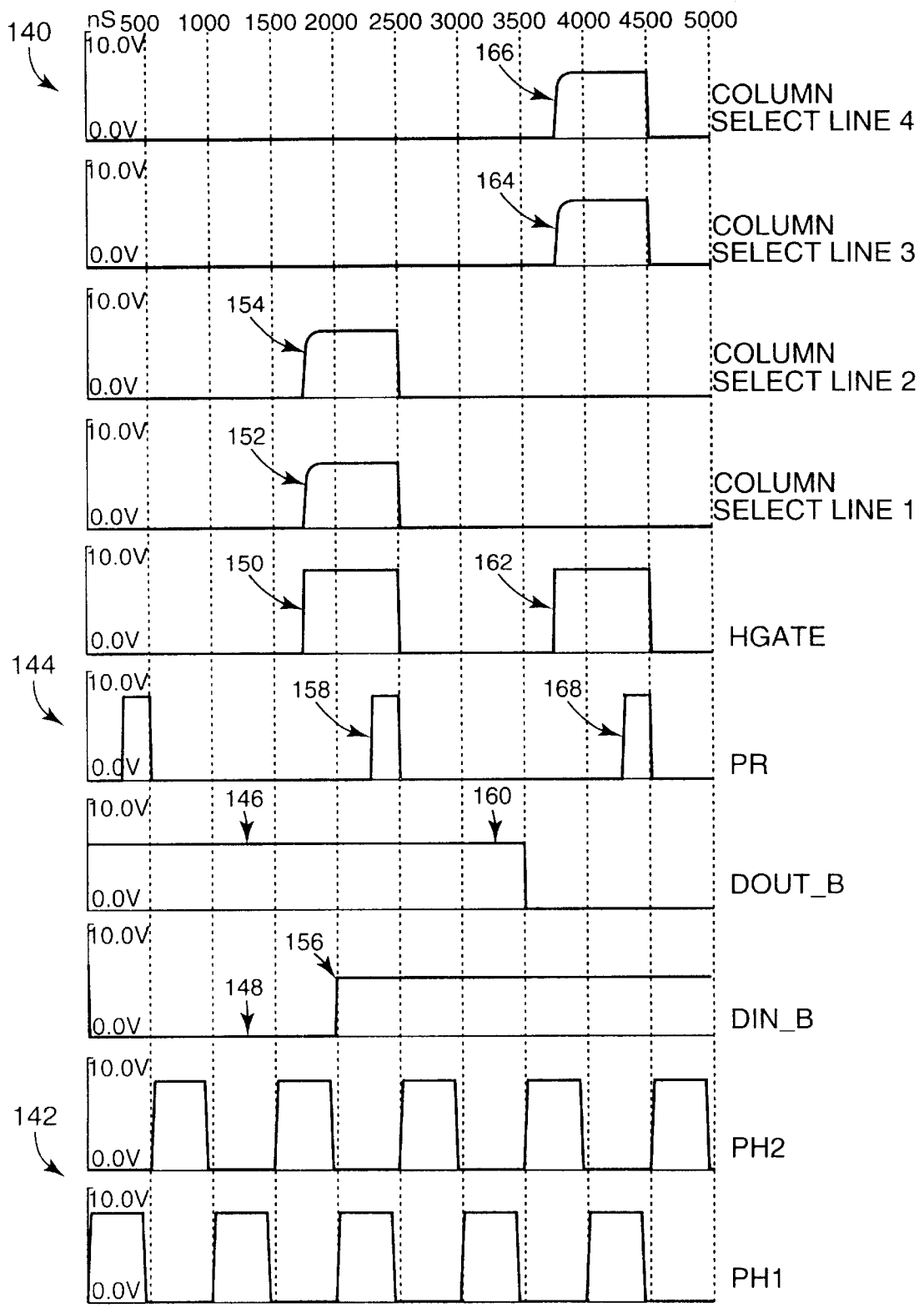
FIG. 10 is a timing diagram for clock and data signals applied to the exemplary embodiment of the pixel array of FIG. 8.

In FIG. 10, a timing diagram 140 is shown for the clock and data signals applied to the example circuit of FIG. 8, and the simulated column select line output wave forms of the four stage horizontal shift register 50. For each timing diagram shown, the y axis ranges between 0 and 10 volts, and the x axis indicates time in nanosecond (ns). As previously indicated, for the purposes of this simulation, row select line 1 and row select line 2 are activated, held at a constant 6 volts, and low resolution switch 24 is closed.

Beginning at time equals 0 nanoseconds, clock PH1 and clock PH2 are shown as two mutually exclusive phases of a single multi-phase clock signal. Each clock pulse remains high for approximately 500 nanoseconds, indicated at 142. At approximately 250 nanoseconds, PR signal is pulsed high (signal 68, 70), resetting signal line 1 and signal line 2 to a reset voltage VR of 4 volts. Further, between 0 and 2000 nanoseconds, DIN_B is logical low (148) and DOUT_B is logic high (146). Prior to 2000 nanoseconds, HGATE is activated (150) enabling activation of column select line 1 (152) and activation of column select line 2 (154). Upon activation of column select line 1 and column select line 2, the charges of pixel elements FD11, FD21, FD12 and FD22 are read out to their corresponding signal lines, signal line 1 and signal line 2.

At t=2000 nanoseconds, a logic high is input at DIN_B (156). After the charge signals are read out to signal line 1 and signal line 2, reset signal PR is again pulsed a logic high to perform a reset function of signal line 1 and signal line 2 (158). At 3500 nanoseconds, data output DOUT_B changes from a logic high to a logic low (160). Since a reset of signal line 1 and signal line 2 has been performed, the charge of the next 2×2 pixel array may now be read out to signal line 1 and signal line 2. Just prior to 4000 nanoseconds, enable signal HGATE is activated (162), activating column select line 3 (164) and column select line 4 (166) to a logic high. After the charge of pixel elements FD31, FD41, FD32 and FD42 are read out to corresponding signal lines, signal line 1 and signal line 2, reset signal PR is again pulsed, performing a reset function of signal line 1 and signal line 2, for reading out the next 2×2 pixel array.

Figure 11:
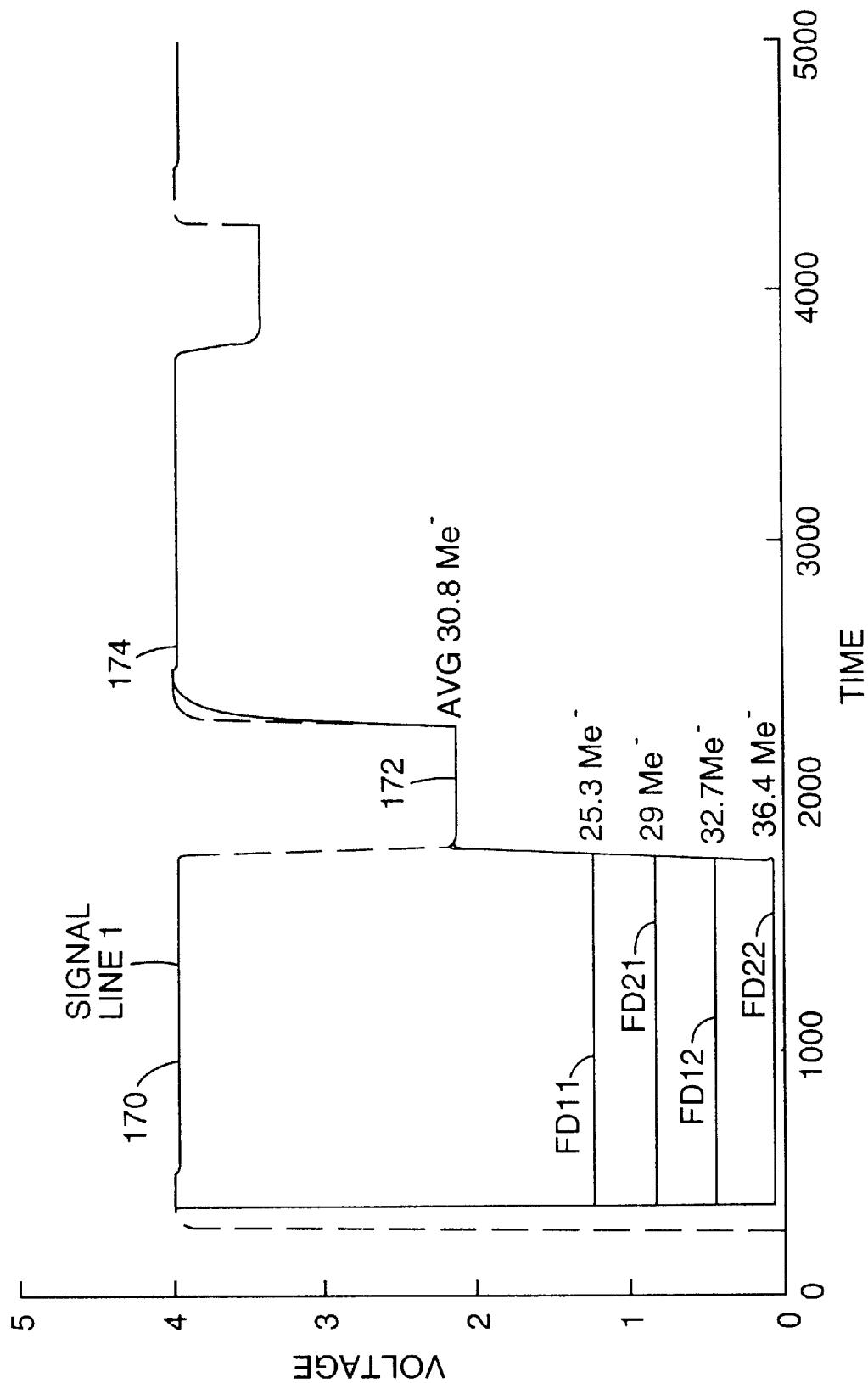
FIG. 11 is an output diagram for the exemplary embodiment shown in FIG. 8.

In FIG. 11, the simulation wave forms on pixel nodes FD11, FD21, FD12 and FD22 are shown, in addition to the wave form on signal line 1 (and signal line 2, which act as a common node), which sums the charge of the above four pixel elements during the first read out, between 0 and 2000 nanoseconds. In the simulation test, the signal charge for pixel FD11 is approximately 25.3 million electrons (Me—), the charge on pixel element FD21 is 29 Me—, the charge on pixel element FD12 is 32.7 Me—, and the charge on pixel element FD22 is 36.4 Me—. Additionally, signal line 1 has been reset to a reset voltage of 4 volts (170). Just prior to 2000 nanoseconds, when HGATE is high and column select line 1 and column select line 2 are activated, the charge on pixel elements FD11, FD21, FD12 and FD22 are read out (summed) to signal line 1 and signal line 2, resulting in an averaged low resolution output signal of 30.8 Me— (172). After the summed output is read out from signal line 1, and just prior to 2500 nanoseconds, signal line 1 is again reset to a reset voltage of 4 volts (174).

Figure 12:
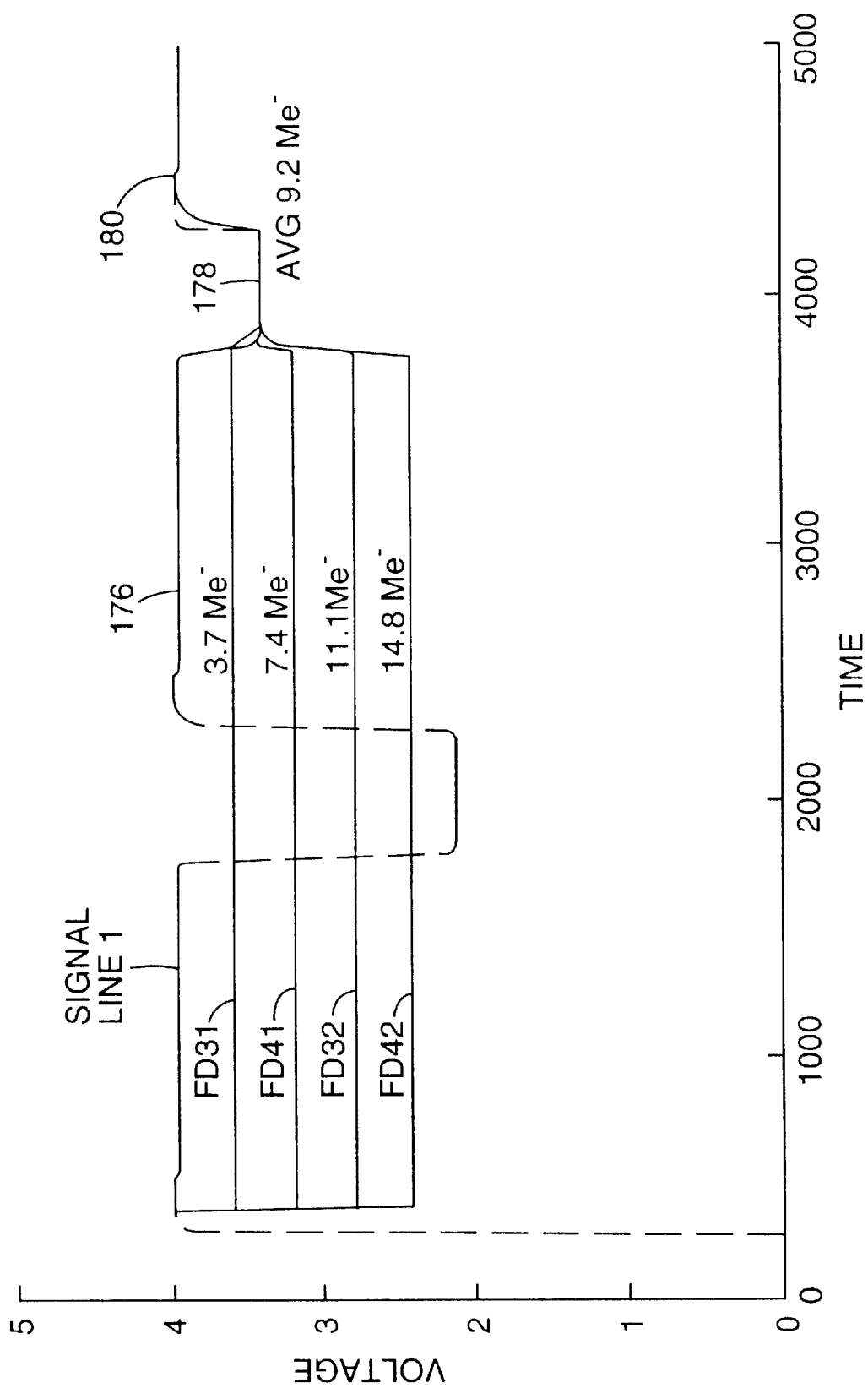
FIG. 12 is another output diagram for the exemplary embodiment shown in FIG. 8.

In FIG. 12, the simulation wave forms on pixel nodes FD31, FD41, FD32 and FD42 are shown, as well as the wave form on signal line 1 which sums the charge on these four pixels during the second read out between T equals 2,000 nanoseconds and T equals 4,000 nanoseconds.

In the simulation, the signal charge on pixel FD31 is 3.7 million electrons, the signal charge on pixel FD41 is 7.4 million electrons, the signal charge on pixel FD32 is 11.1 million electrons, and the signal charge on pixel FD42 is 14.8 million electrons. Additionally, between 2,500 nanoseconds and 3,500 nanoseconds, signal line 1 is at a reset voltage of 4 volts (176). Just prior to 4,000 nanoseconds, HGATE is pulsed a logic high, activating column select line 3 and column select line 4. At that time, the signal charge on pixel elements FD31, FD41, FD32 and FD42 are summed onto signal line 1. A low resolution signal representing the average of the summed charges is read out just prior to 4,000 nanoseconds (178), which is approximately 9.2 million electrons. Again, after the 2×2 A pixel array is summed onto signal line 1 and read out at approximately 4,400 nanoseconds, a reset function is preformed, resetting signal line 1 to a reset voltage of 4 volts (180).

The pixel array in accordance with the present invention can be butted together side-by-side in a seamless manner to form a large area array. The circuit layout can be the four-side distributed configuration, wherein the read-out circuitry is underneath the sensing area. The present invention can also be applied to a pixel array, wherein the read-out circuitry is at a side of the pixel array. For example, the present invention can be applied to a pixel array wherein the read-out circuitry is at two sides (when the number of arrays is 4) or one side (when the number of arrays is more than 4) of the individual array, or a compilation thereof. The space between the arrays may be less than two times the size of the pixels.

The present array and the larger array consisting of a multitude of individual arrays in accordance with the present invention can be used as an x-ray sensor. In this application, the array is covered with a layer of phosphor which converts x-rays into light photons to be detected by the pixel array. An example of potential phosphor candidates is discussed in U.S. Pat. No. 5,391,879, which is herein incorporated by reference.

The layer of phosphor can be coated on each individual pixel array or can be coated on the large area array which has a multitude of individual pixel arrays located below. As an option, the phosphor can be structured phosphor, where the phosphor is formed into islands of which the sides may be smaller or equal to the pixel size of the array. Techniques of making such structured phosphors have been disclosed in U.S. Pat. Nos. 5,302,423; 5,418,377; and WO 9530236.

As an option, in order to further reduce the noise associated with the aforementioned pixel arrays (for example, KTC noise or fixed pattern noise), one can incorporate the correlated doubling sampling circuitry in accordance with the present invention on an integrated circuit chip, wherein the integrated circuit chip may also contain the pixel array. Furthermore, analog to digital converters (ADC) can also be added to the peripheral of the pixel array.

It is recognized that the present invention may be utilized in a continuous photoconductor design, which in one embodiment may be used in direct digital radiography applications. In this embodiment, a multi-module detector incorporates a plurality of detector modules or "tiles". Each of the tiles includes an array of thin film transistors. Each of the transistors is located beneath and coupled to a pixel-sized electrode. A continuous photoconductor layer is formed over the entire multi-module detector assembly. The photoconductor may comprise, for example, amorphous when exposed to radiation and charged, the photoconductor forms a latent image in an image-wise manner. The latent image is produced by discharging portions of the photoconductor with the radiation. Each transistor is switched to sense the charge dissipation in a localized manner via the respective pixel-sized electrode. In this manner, an image can be read-out. Thus, the photoconductor layer and electrode combination takes the place of discrete photodiodes as an alternative to the array disclosed herein. In accordance with the present invention, the photoconductor design may be selectively read out in a high resolution mode or a low resolution mode using summing/binning techniques described herein.

The same above configuration can be applicable to large area flat panel displays, wherein the continuous photoconductor layer can be substituted with a layer of liquid crystal (liquid crystal display) or a layer of luminescent materials, i.e., zinc sulfide, (electroluminescent display).

It should be noted that although the present invention is described in an imager pixel array application, the present invention can also be used in a display pixel array application. Display arrays are similar to imager arrays, although rather than detect light, the pixel elements modulate or emit light in order to produce an overall large display picture. In this example, as an option, the array can be butted together side-by-side to form a larger area display. The present invention is useful in connection with any type of phototransducer element which either detects or transmit light which has an application in an array device.

The novel apparatus and method in accordance with the present invention allows an imager to be read out in a low resolution mode, which also results in higher frame rates by binning (summing) the signal charge contained in an array of adjacent pixels. It is recognized that the array of adjacent pixels, such as a 2×2 array may be part of a larger pixel array, such as an 80×80 pixel die.

When operated in a low resolution mode, the improvement in the maximum frame rate of the imager may be directly proportional to the number of pixels that are combined together in the low resolution mode. For example, if a 2×2 array of adjacent pixels are combined, than the frame rate may be increased by four times. If a 3×3 array of adjacent pixels are combined, the frame rate may be increased by nine times. However, it is also recognized that the frame rate may be limited by other imager elements, such as by the maximum clock rate of the horizontal shift register. In one embodiment, it is recognized that the frame rate would be limited by the maximum clock rate of the horizontal shift register since its speed is required to be M times the output signal rate, where M is the number of adjacent horizontal pixels that are combined.

It will be understood that the disclosed embodiments are, in many respects, only illustrative. Changes may be made in details, particularly in matters of shape, size, material, and arrangement of parts, without exceeding the scope of the invention. Accordingly, the scope of the invention is as defined in the language of the appended claims.

What is claimed is:

1. A pixel array having a low resolution mode comprising:
   a first signal line;
   a second signal line;
   a first row select line;
   a second row select line;
   an array of pixel elements, each pixel element coupled to the first signal line or the second signal line;
   a switch coupled between the first signal line and the second signal line wherein the switch is activated independent of the first row select line and the second row select line; and means for conveying a charge associated with each pixel element between the pixel element and a predetermined signal line.

2. The pixel array of claim 1, wherein the switch is responsive to a low resolution input signal.

3. The pixel array of claim 1, wherein the switch includes a transistor.

4. The pixel array of claim 1, further comprising:

an output signal line;

a first signal buffer coupled between the first signal line and the output signal line; and a second signal buffer coupled between the second signal line and the output signal line.

5. The pixel array of claim 4, wherein:

the first signal buffer includes a transistor configured as a source follower; and the second signal buffer includes a transistor configured as a source follower.

6. The pixel array of claim 4, further comprising means for selectively outputting the buffered output signals to an imaging device.

7. The pixel array of claim 6, wherein the means for selectively outputting the buffered output signals includes a multiplexer.

8. The pixel array of claim 1, further comprising means coupled to the first signal line and the second signal, for resetting the first signal line and the second signal line.

9. In a pixel array for use in an imaging device, the pixel array having an array of pixel elements, a first signal line, a second signal line, a pair of adjacent column select lines, and a pair of adjacent row select lines, the improvement comprising means for coupling the first signal line to the second signal line, wherein each pixel element includes:

a phototransducer means;

means for conveying signals between the phototransducer means and a predetermined signal line, wherein the means for conveying signals is responsive to an activated row select line and an activated column select line;

first means for activating the pair of adjacent column select lines; and second means for activating the pair of adjacent row select lines, wherein the means for coupling the first signal line to the second signal line is activated independent of the pair of adjacent column select lines and pair of adjacent row select lines.

10. The pixel array of claim 9, wherein the first means for activating includes a shift register coupled to the pair of adjacent column select lines.

11. The pixel array of claim 9, wherein the second means for activating includes a shift register coupled to the pair of adjacent row select lines.

12. The pixel array of claim 9, further comprising means for providing a buffered output signal representative of the signals conveyed to the first signal line and the second signal line.

13. The pixel array of claim 12, wherein the means for providing a buffered output signal includes:

a buffered output signal line;

first means for buffering coupled between the first signal line and the buffered output signal line; and second means for buffering coupled between the second signal line and the buffered output signal line.

14. The pixel array of claim 13, wherein the first means for buffering and the second means for buffering include a transistor configured as a source follower.

15. The pixel array of claim 9, wherein the pixel array is an x-ray detector.

16. In a pixel array for use in an imaging device, the pixel array having an array of pixel elements, a first signal line, a second signal line, a pair of adjacent column select lines, and a pair of adjacent row select lines, the improvement comprising means for coupling the first signal line to the second signal line, wherein each pixel element includes:

a phototransducer means;

means for conveying signals between the phototransducer means and a predetermined signal line, wherein the means for conveying signals is responsive to an activated row select line and an activated column select line;

first means for activating the pair of adjacent column select lines; and second means for activating the pair of adjacent row select lines, wherein the means for coupling the first signal line to the second signal line is activated independent of the pair of adjacent column select lines and pair of adjacent row select lines, and wherein the pixel array is part of a large area array formed of a plurality of pixel arrays butted together in a side-by-side seamless manner, and further comprising read-out circuitry, wherein the read-out circuitry from the pixel arrays can be located either below the pixel element or adjacent the pixel element of each individual pixel array.

17. The pixel array of claim 16, further comprising:

a double sampling circuit; and an analog-to-digital converter; wherein the double sampling circuit and analog-to-digital converter are located on an integrated circuit chip coupled to the pixel array.

18. The pixel array of claim 16, further comprising:

a double sampling circuit; and an analog-to-digital converter; wherein the double sampling circuit and analog-to-digital converter are located on the same integrated circuit chip.

19. A method of reading out a pixel array in a low resolution mode, the method comprising the steps of:

providing a first output signal line and a second output signal line;

providing a first row select line and a second row select line, providing an array of pixel elements, each pixel element coupled to the first signal line or the second signal line;

coupling the first output signal line to the second output signal line independent of the first row select line and the second row select line; and reading a charge associated with each pixel element to the first output signal line and the second output signal line, respectively.

20. The method of claim 19, further comprising the step of providing an isolated output signal representative of the charges read out to the first output signal line and the second output signal line.

21. The method of claim 19, further comprising the step of conveying an output signal representative of the charges output to the first output signal line and the second output signal line to an imaging device.

22. The method of claim 19, further comprising the step of resetting the first output signal line and the second output signal line to a reference voltage.

23. The method of claim 19, wherein reading a charge further comprising the steps of:

provided a first column select line and a second column select line;

activating the first row select line and the second row select line;

activating the first column select line and the second column select line;

wherein each pixel element is responsive to activation of a predetermined row select line and activation of a predetermined column select line for reading the charge associated with the pixel element to a predetermined first output signal line or second output signal line.

24. The method of claim 23, wherein the first row select line and the second row select line are activated by shifting adjacent ones through a shift register.

25. The method of claim 19, wherein coupling the first output signal line to the second output signal line includes the step of providing an input signal to a switch, wherein the switch is responsive to the input signal for coupling the first output signal line to the second output signal line.

26. The method of claim 25, wherein the switch utilizes transistor logic.

27. The method of claim 19, wherein providing an isolated output signal representative of the charges read out to the first output signal line and the second output signal line includes the steps of:

providing a buffered output signal line;

coupling a first buffer circuit between the first output signal line and the buffered output signal line; and coupling a second buffer circuit between the second output signal line and the buffered output signal line.

28. The method of claim 27, wherein the first buffer circuit and the second buffer circuit include a transistor configured as a source follower.

29. A pixel array having a low resolution mode comprising:

a first signal line;

a second signal line;

an array of pixel elements, each pixel element coupled to the first signal line or the second signal line;

switch means for coupling between the first signal line and the second signal line, wherein the switch means is activated independent of the first row select line and the second row select line; and means for conveying a charge associated with each pixel element between the pixel element and a predetermined signal line.

30. The pixel array of claim 29, further comprising:

an output signal line;

a first means for buffering signals coupled between the first signal line and the output signal line; and a second means for buffering signals coupled between the second signal line and the output signal line.

31. The pixel array of claim 30, wherein:

the first means for buffering signals includes a transistor configured as a source follower; and the second means for buffering signals includes a transistor configured as a source follower.

32. A pixel array including an array of pixel elements, the pixel array having a low resolution mode, the pixel array comprising:

M signal lines, wherein M is greater than or equal to 2;

X row select lines, wherein X is greater than or equal to 2;

N column select lines, wherein N is greater than or equal to 2;

M-1 switches coupling together the M signal lines;

means for simultaneously activating M-1 switches and selecting N columns, independent of any of the X row select lines;

wherein each pixel element includes a phototransducer means; and means for conveying signals between the phototransducer means and a predetermined signal line, wherein the means for conveying signals is responsive to an activated column select line.

33. A medical imager including a pixel array having a high resolution radiographic imaging mode and a low resolution fluoroscopic imaging mode, the pixel array comprising:

a first signal line;

a second signal line;

a switch coupled between the first signal line and the second signal line;

an array of pixel elements, each pixel element coupled to the first signal line or the second signal line;

means for conveying a charge associated with each pixel element between the pixel element and a predetermined signal line; and means for switching the medical imager between the high resolution radiographic imaging mode and the low resolution fluoroscopic imaging mode, including means for activating the switch.

34. The medical imager of claim 33, further comprising:

an output signal line;

a first signal buffer coupled between the first signal line and the output signal line; and a second signal buffer coupled between the second signal line and the output signal line.

35. The medical imager of claim 33, wherein the means for switching further comprises:

a plurality of row select lines;

a plurality of column select lines; and means for selectively activating a predetermined number of row select lines and column select lines.

* * * * *